United States Patent [19]
Northan et al.

[11] Patent Number: 5,721,515
[45] Date of Patent: Feb. 24, 1998

[54] HIGH STABILITY SINGLE-PORT SAW RESONATOR OSCILLATOR

[75] Inventors: Alan R. Northan, Allen; Peter V. Wright, Dallas, both of Tex.

[73] Assignee: RF Monolithics, Inc., Dallas, Tex.

[21] Appl. No.: 705,186

[22] Filed: Aug. 29, 1996

[51] Int. Cl.⁶ .................................................. H03B 5/00
[52] U.S. Cl. ........................ 331/107 A; 331/74; 331/77; 331/173
[58] Field of Search ................. 331/107 A, 108 C, 331/116 R, 116 FE, 117 R, 117 FE, 117 D, 173, 74, 77

[56] References Cited

U.S. PATENT DOCUMENTS

| 4,621,421 | 11/1986 | Kiser | 331/117 R |
| 4,760,352 | 7/1988 | Ash | 331/107 A |
| 5,004,989 | 4/1991 | Hasler | 331/117 R |
| 5,025,229 | 6/1991 | Hasegawa et al. | 331/107 A |
| 5,532,654 | 7/1996 | Ieki et al. | 331/107 A X |

OTHER PUBLICATIONS

Benjamin Parzen, "Design of Crystal and Other Harmonic Oscillators", A Wiley–Interscience Publication, 1983, pp. 126–127, 134–135.

*Primary Examiner*—David Mis
*Attorney, Agent, or Firm*—Jones, Day, Reavis & Pogue

[57] ABSTRACT

A high stability clock oscillator circuit that has no inductors in the oscillator circuit itself. In the preferred embodiment neither the collector, the base, nor the emitter of the transistor is grounded and the oscillator output is taken from the collector of the transistor. In an alternate embodiment the collector is AC grounded and the output is taken across a load resistor coupled between the emitter of the transistor and ground. The resulting oscillator is a high stability oscillator that can be used as a clock oscillator in high frequency circuits.

14 Claims, 3 Drawing Sheets

HIGH STABILITY SINGLE-PORT SAW RESONATOR OSCILLATOR

BACKGROUND OF THE INVENTION

1. Field of the Invention

The present invention relates in general to oscillators and in particular to a high stability oscillator having a single-port resonator coupled between the base of a transistor and ground and that has an output circuit for providing complementary outputs and that is highly stable with environmental and component changes and has particular value as a clock oscillator.

2. Description of Related Art Including Information Disclosed Under 37 CFR 1.97 and 1.98

High frequency oscillators are used for a number of purposes. Among these purposes is to generate clock pulses for use in computer processing systems and the like. Obviously such clocks must be very accurate and not subject to substantial instability.

There are different constructions of such oscillators, one of which is illustrated in FIG. 1. The oscillator 10 has a transistor 12 with a capacitor 14 coupled between the emitter and ground 18 to cause oscillations by making the circuit unstable. The coil 16, as is well known, has a low Q value (i.e. 50) and defines the frequency of oscillation. The output oscillations are coupled through resistor 20 and across load resistor 22 to form the output at line 24. This circuit has several disadvantages. First, it has a very wide bandwidth and, second, it is too unstable to be used as a clock pulse generator. FIG. 2 is a graph illustrating the range of oscillation of the circuit 10. As is well known, for the circuit to operate, at the point of oscillation the resistance at the ground end of coil 16 must be negative and the reactance must be zero. It will be noted that while the resistance 15 is negative, the reactance is zero for a wide range that could be in the order of 150 kilohertz. The range of oscillation during this period is known as jitter and causes the circuit of FIG. 1 to be unusable for a high frequency clock pulse generator because of its instability.

FIG. 3 is an example of another prior art clock oscillator circuit that produces complementary outputs Q and $\overline{Q}$. Circuit 26 is a coupled resonator oscillator and utilizes two matched surface acoustic wave devices 28 and 30 on the input and output, respectively, of the circuit 26. This circuit is quite stable; however, it has several disadvantages. First, it has to have matched surface acoustic wave (SAW) devices on the input and output to get the maximum output power. The formation of such SAW devices is very expensive. Further, each is a two-port resonator which also increases the cost of the SAW devices.

FIG. 4 is a block diagram of an AC representation of a Colpitts family of oscillators. The circuit 25 includes a ground line 23 surrounding the oscillator circuit. When the collector, c, of transistor 27 is coupled to ground 23 as indicated by phantom line 29, a conventional Colpitts oscillator is formed. When the emitter, e, of transistor 27 is coupled to ground 23 as indicated by phantom line 33, a Pierce oscillator is formed. Finally, when the base, b, of transistor 27 is coupled to ground 23 as indicated by phantom line 31, a Clapp oscillator is established. In each of these cases, either the collector, the emitter, or the base of the transistor 27 is grounded. Thus, each of these circuits requires an inductor, $(Z_3)$, in the external circuit, $(Z_1$ and $Z_2$ being capacitors). This inductor is costly and absorbs RF power. See a further discussion of these circuits in Parzen, "Design of Crystal and other Harmonic Oscillators", 1983, John Wiley and Sons.

Thus, there is a need for an oscillator that is economical to construct, easy to assemble, has high stability over a wide range of environmental changes, load changes, and component value changes. Further, such oscillator should produce complementary outputs that are 180° out-of-phase with each other.

SUMMARY OF THE INVENTION

By using a circuit similar to the circuit in FIG. 1 but utilizing a single-port resonator coupled between the transistor base and ground with a capacitor coupling the base to the emitter, an oscillator is obtained that has very high stability, is easy to construct and can be utilized on a single chip as an integrated circuit, and which is economical to construct.

Thus, it is an object of the present invention to provide a high stability oscillator that can be used for a clock pulse generator.

It is also an object of the present invention to provide a high stability oscillator that utilizes a single-port resonator surface acoustic wave device to establish the frequency of oscillation of the oscillator.

It is still another object of the present invention to provide a high stability oscillator that may or may not have an enable port.

It is yet another object of the present invention to provide a high stability oscillator that has a balun on the output thereof for converting the single output to complementary outputs.

Thus, the present invention relates to a single-port high stability resonator oscillator comprising a transistor having a base, an emitter, and a collector, the collector providing an oscillator output signal; a single-port resonator coupled between the transistor base and a ground potential; first and second series connected capacitors coupled between the transistor base and the ground potential; a first resistor having a first end coupled to both the transistor emitter and to the connection between the capacitors and a second end coupled to the ground potential; and a second resistor having a first end connected to the transistor base and a second end connected to a power source for providing a bias to the base and collector of the transistor. If desired, a third resistor having a first end connected to the transistor base and a second end connected to ground potential may be used as a basic arrangement. It is to be understood that the invention also includes all known methods in the state of the art for biasing the base and/or collector of the transistor. The invention also includes a balun output circuit having a single input coupled to the transistor collector and a balanced output for generating true and complement oscillator output signals.

The invention also broadly relates to an inductorless oscillator having a stability greater than the stability of an oscillator circuit having an inductor therein, the inductorless oscillator comprising a transistor having a base, an emitter, and a collector; a single-port SAW resonator coupled between the transistor base and ground, the SAW having a Q value greater than that achievable with the oscillator circuit having the inductor therein; and an electrical circuit coupled to the transistor such that each of the transistor base, emitter, and collector terminals are isolated from ground potential.

BRIEF DESCRIPTION OF THE DRAWINGS

These and other features of the present invention will be more fully disclosed when taken in conjunction with the

Figure 1:
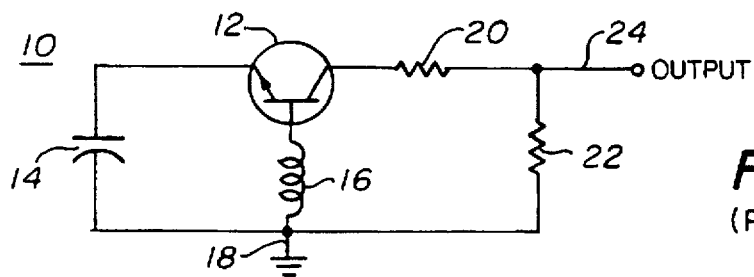
Figure 2:
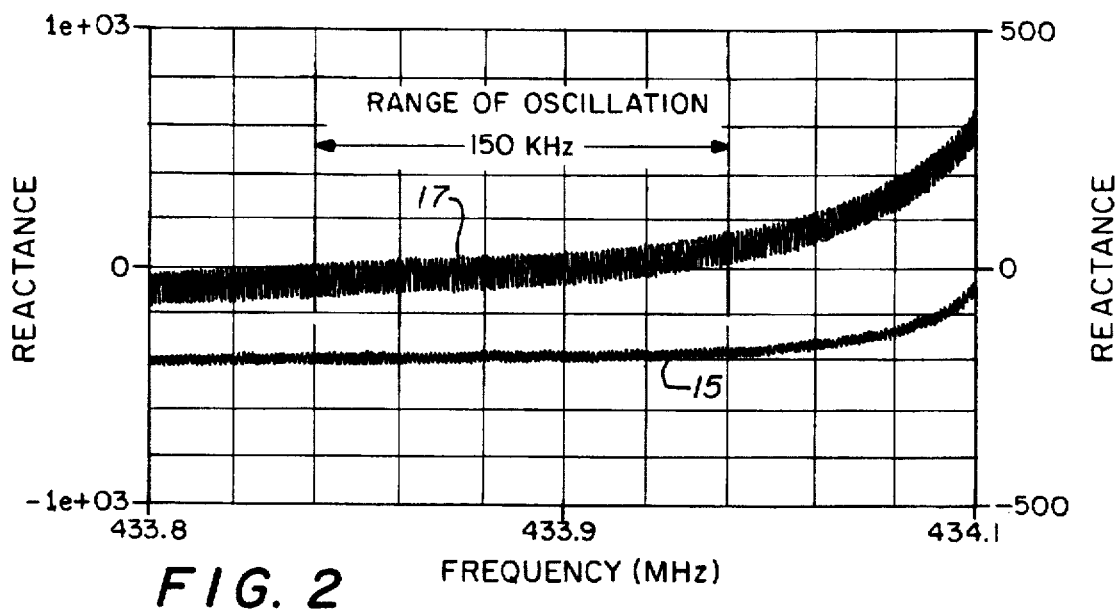
Figure 3:
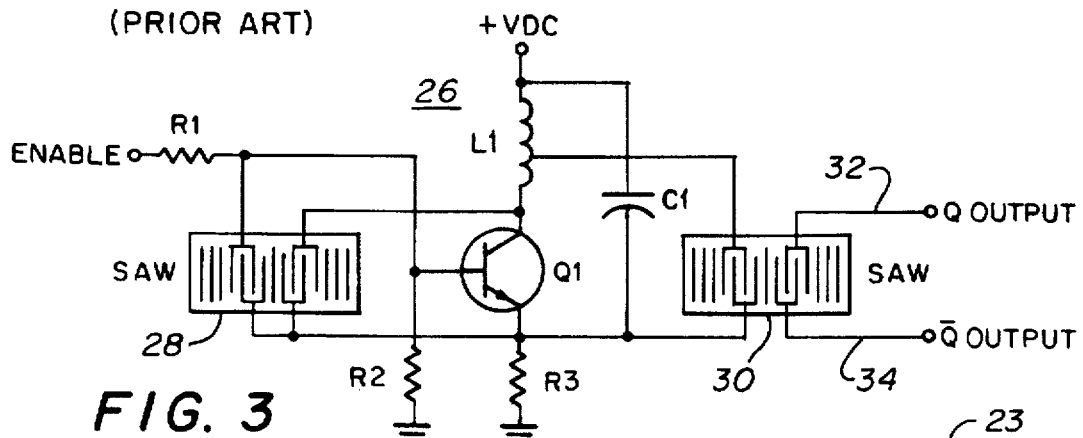
Figure 4:
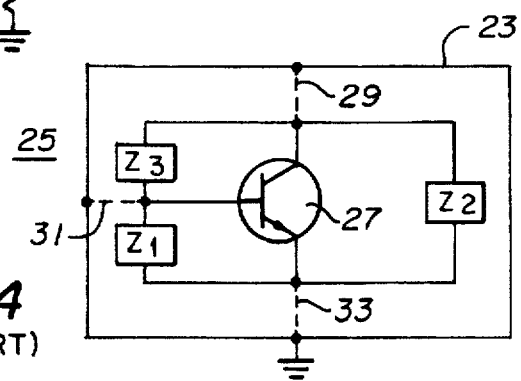
Figure 5:
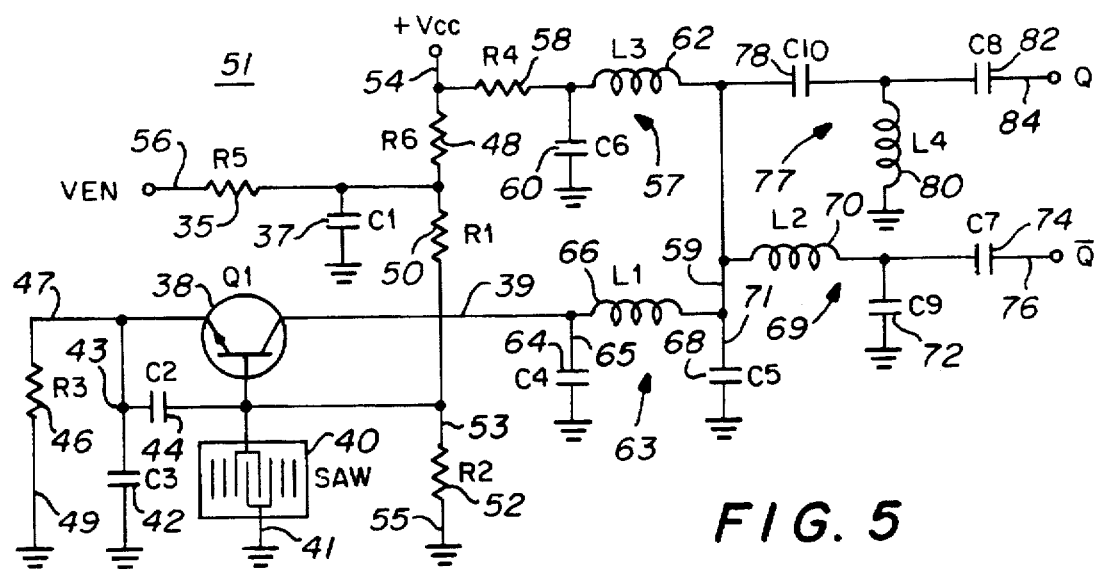
Figure 6:
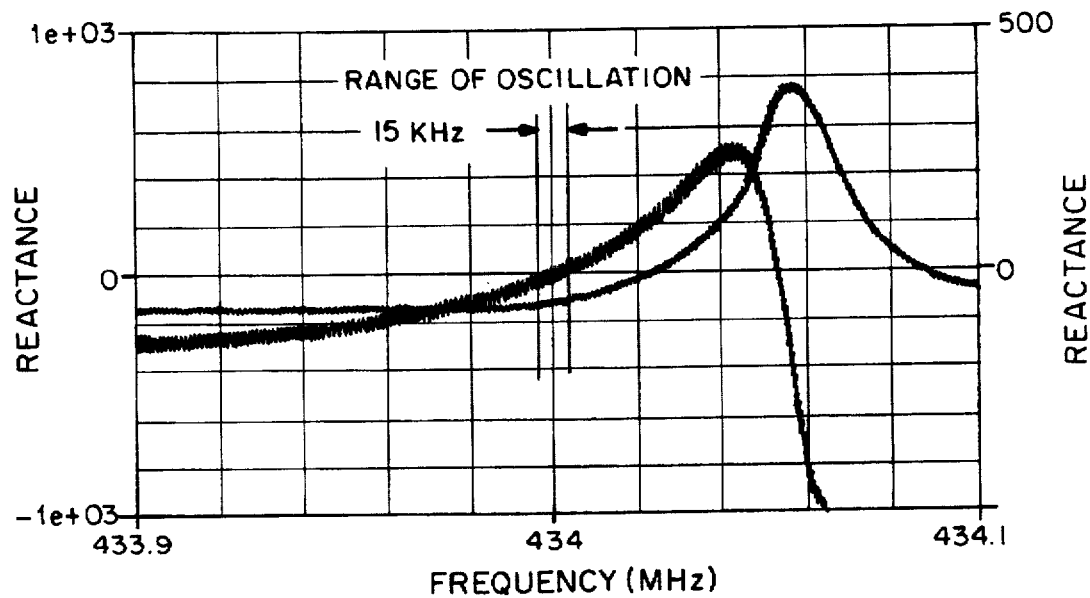
Figure 7:
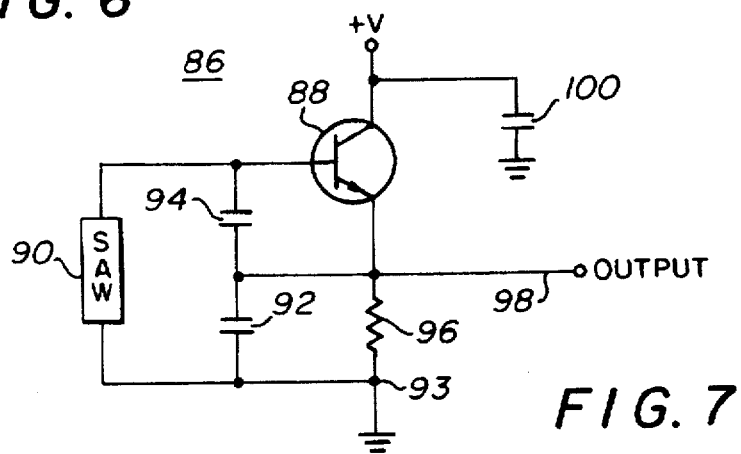
Figure 8:
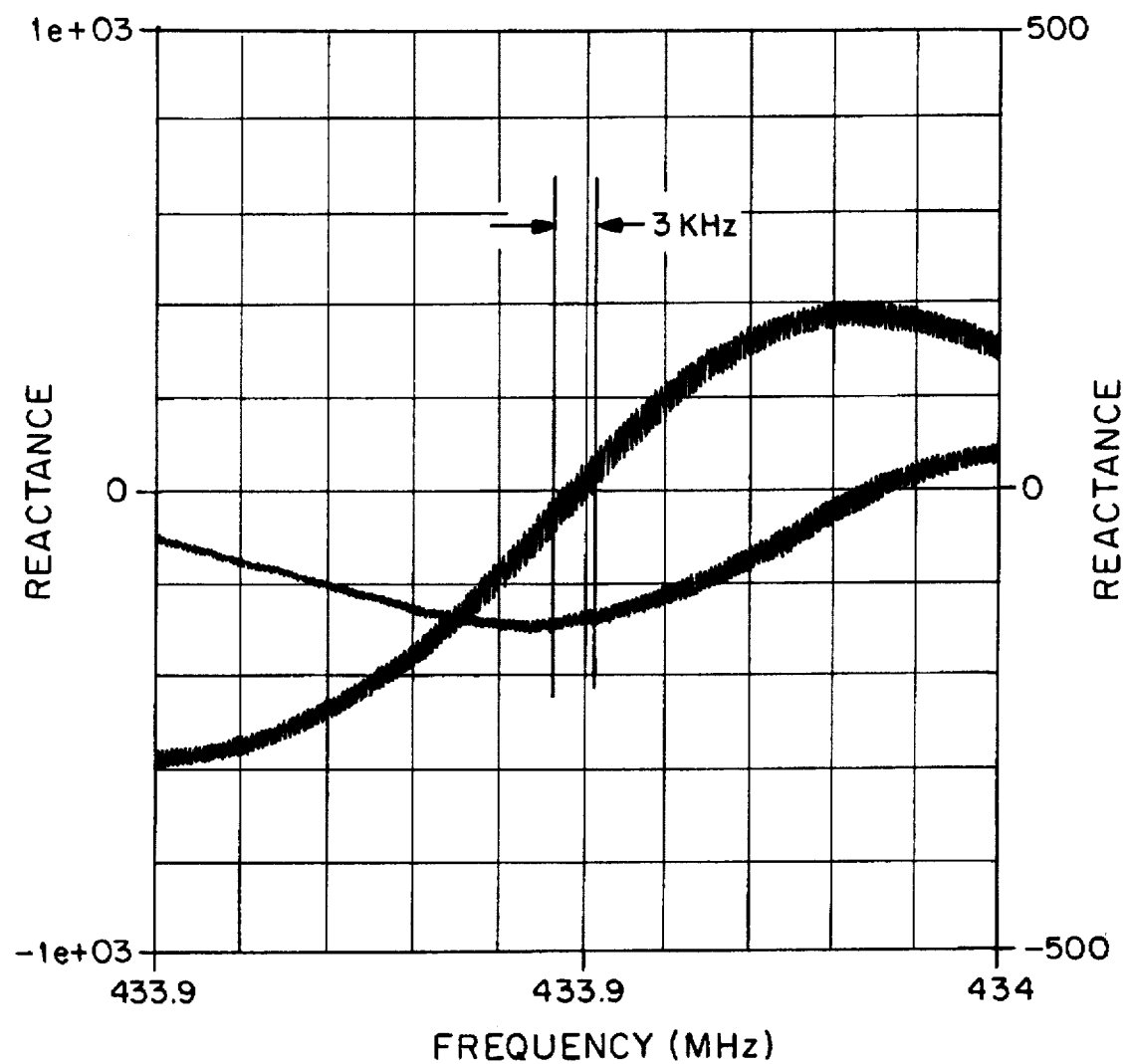

3 following DETAILED DESCRIPTION OF THE PREFERRED EMBODIMENTS in which like numerals represent like elements and in which:

FIG. 1 is a circuit diagram of a prior art high frequency oscillator;

FIG. 2 is a graph of the oscillation jitter or instability of the oscillator of FIG. 1;

FIG. 3 is a circuit diagram of a prior art coupled resonator oscillator producing complementary outputs;

FIG. 4 is a general circuit diagram illustrating the AC representation of the Colpitts family of oscillators including the conventional Colpitts, the Pierce, and the Clapp oscillators;

FIG. 5 is a circuit diagram of the novel high stability oscillator of the present invention;

FIG. 6 is a graph illustrating the range of jitter of the novel circuit illustrated in FIG. 5;

FIG. 7 is a circuit diagram of an alternate embodiment of the novel high stability of the present invention; and FIG. 8 is a graph illustrating the high stability of the novel circuit of FIG. 7 because of the narrow range of jitter.

DETAILED DESCRIPTION OF THE PREFERRED EMBODIMENTS

In FIG. 5, the novel inductorless oscillator circuit 36 includes a transistor 38 having a single-port surface acoustic wave resonator 40 coupled to the base thereof to define the frequency of oscillation of the oscillator in circuit 36. The transistor 38 may be a bipolar transistor of the type such as the NE856 series. Single-port SAW resonators are well known in the art. Such resonator has a very high Q as is well known in the art, in the order of 5000, which gives great stability to the oscillator. SAW devices with a Q above 5000 could also be used to provide high stability by changing other component values. The SAW device 40 never resonates with any of the circuit elements so that the base of transistor 38 is never grounded with respect to AC as is the Colpitts family of oscillator circuits shown in FIG. 4. Capacitor 42 causes the transistor 38 to become unstable and thus oscillate. Capacitor 44 increases the gain at low frequency and does not have to be in the circuit at high frequencies because the value of capacitor 44 decreases with an increase in frequency. Resistor 46 is a bias resistor for the emitter of transistor 38. Resistors 48, 50, and 52 form a voltage divider circuit for providing the necessary power or bias to the base of transistor 38 to allow operation of the circuit 36. Power supply voltage on line 54 is coupled to the resistors 48, 50, and 52. An enable signal may be applied to a line 56 to add sufficient bias to enable circuit 36 at a particular instant in time and also includes a noise filter comprised of resistor 35 and capacitor 37. A power supply filter 57 includes a resistor 58, capacitor 60, and coil 62 coupled as shown. Thus, the oscillator alone in oscillator circuit 36 is inductorless.

The output of the oscillator from transistor 38 on the collector is a single output (line 39) isolated by transistor 38 from the rest of the circuit and is coupled to a first filter 63 that comprises a capacitor 64, coil 66, and capacitor 68 arranged in a pi network shape.

Thus the high stability single-port SAW resonator oscillator itself comprises a transistor 38 having a base, an emitter, and a collector with the collector providing an isolated oscillator output signal on line 39 to the pi network 63. The single-port resonator 40 is coupled between the base of transistor 38 and a ground potential 41 and never grounds the base of transistor 38 during oscillator operation. First and second series coupled capacitors 42 and 44 are coupled between the transistor base and the ground potential 41. A first resistor 46 has a first end 47 coupled to a junction 43 between the capacitors 42 and 44 and the emitter of transistor 38, and a second end 49 coupled to the ground potential 41. A second resistor 52 has a first end 53 connected to the transistor base and coupled to a power supply and a second end 55 connected to the ground potential 41. A balun output circuit 51 has a single input 39 coupled to the transistor collector and a balanced output 76 and 84 for generating true and complementary oscillator output signals.

The first filter 63 of balun 51 has an input 39 connected to the collector of transistor 38 and an output 59. The first filter 63 includes first and second capacitors 64 and 68 each having a first end 65 and 71, respectively, and a second end connected to ground potential 41. A first inductor 66 has a first end coupled to both the collector of transistor 38 on line 39 and the first end 65 of capacitor 64. The second end of the first inductor 66 is coupled to the first end 71 of the other capacitor 68 and forms a single line output frequency at line 59 from the oscillator transistor 38.

The balun circuit includes second and third filters 69 and 77 coupled in parallel with each other and each has a first end forming an input that is coupled to the single output of the first filter 63 on line 59.

Filter 69 has an inductor 70 with one end coupled to the single output of filter 63 on line 59 and a second end coupled to capacitors 72 and 74. Capacitor 72 has the other end coupled to ground and capacitor 74 has the other end as the complementary output on line 76.

The third filter 77 has a capacitor 78 with one end coupled to the line 59 and the other end coupled to a coil 80 and a capacitor 82. The other end of the coil 80 is connected to ground and the other end of capacitor 82 forms the output on line 84 and is of the opposite phase from that on line 76. The output on line 84 may be Q and the output on line 76 may be $\overline{Q}$. Thus, these two signals are 180° apart, one being a 90° + and the other 90° −.

It can be seen from FIG. 6 that this circuit has excellent jitter characteristics. Note, that the range of oscillation where the reactance of the circuit is zero is a very narrow 15 kilohertz. Thus, the circuit is highly stable and can be used for highly accurate clock pulses.

FIG. 7 illustrates an alternate version of the present invention wherein the output of the oscillator circuit 86 is taken from the emitter of the transistor. In this particular case, the oscillator circuit 86 includes a transistor 88 having a surface acoustic wave device 90 coupled between the base of transistor 88 and ground 93. In addition, capacitor 92 causes the circuit to become unstable and enables the circuit to oscillate. Capacitor 94 again increases the gain at low frequencies. The SAW device 90 determines the frequency of oscillation. The output is taken across load resistor 96 on line 98. In this particular oscillator, the collector is coupled to ground through capacitor 100 thus forming an AC ground for the collector. The balun 51 of FIG. 5 could be used with this embodiment to provide true and complement outputs. Again, no inductor is required in the oscillator circuit itself.

FIG. 8 is a graph illustrating the narrow jitter bandwidth of three kilohertz for this circuit. Thus, it is a highly stable circuit and has application in high frequency circuits as a clock oscillator.

The corresponding structures, materials, acts, and equivalents of all means or step plus function elements in the claims below are intended to include any structure, material, or act for performing the function in combination with other claimed elements as specifically claimed.

We claim:

1. A high stability clock oscillator comprising:
   a transistor having a base, an emitter, and a collector, said collector providing a single oscillating output signal;
   a single-port SAW resonator directly connected between said base and a ground potential;
   first and second series connected capacitors coupled between said transistor base and said ground potential;
   a first resistor having a first end coupled to both said transistor emitter and to the connection between said capacitors and a second end coupled to said ground potential; and
   a second resistor having a first end connected to said transistor base and a second end connected to a power source, the single output signal of said oscillator being taken from the collector of said transistor.

2. A high stability clock oscillator as in claim 1 further including a balun output circuit having a single input coupled to said transistor collector and a balanced output for generating true and complement oscillator output signals.

3. A high stability clock oscillator as in claim 1 wherein said oscillator circuit includes a first filter having an input coupled to said transistor collector and an output.

4. A high stability clock oscillator as in claim 1 wherein said first filter comprises:
   first and second capacitors each having a first and a second end;
   the second end of each capacitor being connected to a ground potential;
   a first inductor having a first end coupled both to the first end of one of said capacitors and the collector of said transistor; and
   the second end of said first inductor being coupled to the first end of the other one of said capacitors and forming a single output frequency from the oscillator.

5. A high stability clock oscillator as in claim 4 wherein said balun output circuit includes second and third filters coupled in parallel and each having a first end forming an input coupled to the single output of said first filter.

6. A high stability clock oscillator as in claim 5 wherein said second filter includes:
   a second inductor having a first end coupled to the signal output of said first filter and a second end;
   third and fourth capacitors each having one end connected to the second end of said second inductor and each of the third and fourth capacitors having a second end; and
   the second end of one of said third and fourth capacitors being connected to ground potential and the second end of the other capacitor providing one of said complementary output signals.

7. A high stability clock oscillator as in claim 6 wherein said third filter includes:
   a fifth capacitor having a first end coupled to the signal output of said first filter and having a second end;
   a third inductor having a first end connected to second end of said fifth capacitor and a second end coupled to said ground potential; and
   a sixth capacitor having one end connected both to said second end of said fifth capacitor and said first end of said third inductor and a second end for providing an output signal complementary to the other output signal.

8. The high stability clock oscillator as in claim 1 wherein said transistor is a bipolar transistor.

9. A high stability clock oscillator as in claim 1 further including:
   a power supply coupled to said transistor collector; and
   a power supply filter coupled between said collector and said power supply.

10. A high stability clock oscillator as in claim 1 further including:
    an input circuit coupled to the base of said transistor for selectively providing an input voltage to said base to enable said circuit to oscillate and to disable said oscillator circuit when said input voltage is removed.

11. A high stability clock oscillator as in claim 1 further including a third resistor having a first end connected to said transistor base and a second end connected to ground potential for biasing the base and collector of the transistor.

12. An inductorless high stability oscillator comprising a transistor having a collector, a base, and an emitter;
    a single-port surface acoustic wave resonator directly connected between said transistor base and a ground potential;
    first and second series connected capacitors coupled between said transistor base and said ground potential;
    a resistor having a first end coupled to both said transistor emitter and to the connection between said capacitors and second end coupled to said ground potential;
    a capacitor coupled between said transistor collector and ground to provide a AC ground for said collector; and
    an output line coupled to the emitter of said transistor for producing said oscillator output signal.

13. An inductorless high stability oscillator as in claim 12 further including a balun having a single input coupled to said oscillator output and first and second outputs for providing true and complement oscillator output signals.

14. An inductorless high stability oscillator as in claim 12 further including a power supply coupled to the collector of said transistor.

* * * * *

UNITED STATES PATENT AND TRADEMARK OFFICE
CERTIFICATE OF CORRECTION

PATENT NO. : 5,721,515
DATED : Feb. 24, 1998
INVENTOR(S) : Northam et al.

It is certified that error appears in the above-identified patent and that said Letters Patent is hereby corrected as shown below:

On the title page, item [19]:

Inventor's name "Northan et al." appearing at the top of the patent should be corrected to read --Northam et al.--.

Item [75] "Northan" should read --Northam--.

In the next-to-last-line of the ABSTRACT "dock" should read --clock--.

Column 1, line 37, "dock" should read --clock--.

Column 5, line 4, "dock" should read --clock--.

Signed and Sealed this

Fourteenth Day of July, 1998

*Attest:*

BRUCE LEHMAN

*Attesting Officer*  *Commissioner of Patents and Trademarks*